US011896120B2

(12) United States Patent
Tharp

(10) Patent No.: US 11,896,120 B2
(45) Date of Patent: Feb. 13, 2024

(54) SYSTEMS AND COMPONENTS FOR ANCHORING OBJECTS TO RACK MOUNT SYSTEMS AND ASSEMBLIES

(71) Applicant: Marquette University, Milwaukee, WI (US)

(72) Inventor: Timothy D. Tharp, Milwaukee, WI (US)

(73) Assignee: Marquette University, Milwaukee, WI (US)

( * ) Notice: Subject to any disclaimer, the term of this patent is extended or adjusted under 35 U.S.C. 154(b) by 163 days.

(21) Appl. No.: 16/970,709

(22) PCT Filed: Feb. 23, 2018

(86) PCT No.: PCT/US2018/019402
§ 371 (c)(1),
(2) Date: Aug. 18, 2020

(87) PCT Pub. No.: WO2019/164504
PCT Pub. Date: Aug. 29, 2019

(65) Prior Publication Data
US 2021/0085077 A1 Mar. 25, 2021

(51) Int. Cl.
*A47B 57/38* (2006.01)
(52) U.S. Cl.
CPC .............. *A47B 57/38* (2013.01); *Y10S 211/01* (2013.01)
(58) Field of Classification Search
CPC ....... A47B 57/38; A47B 88/44; A47B 96/061; A47B 96/07; H05K 7/1489; H05K 7/186; Y10S 211/01; F16B 7/10
See application file for complete search history.

(56) References Cited

U.S. PATENT DOCUMENTS 5,680,579 A 10/1997 Young et al.
5,791,498 A 8/1998 Mills
(Continued)

FOREIGN PATENT DOCUMENTS

CN 105625672 6/2016

OTHER PUBLICATIONS

U.S. Pat. No. 4,56,840, entitled Refrigerator, issued to John Outhet on Jul. 28, 1891.
(Continued)

*Primary Examiner* — Devin K Barnett
(74) *Attorney, Agent, or Firm* — Andrus Intellectual Property Law, LLP

(57) ABSTRACT

An anchoring device for securing objects within a rack mount system using fasteners. The anchoring device has a base portion with flush and anchor faces, the anchor faces defining apertures. Hooks are provided for securing the anchoring device to the rack mount system. Each hook has a horizontal arm with base and distal ends, and a vertical arm with upper and lower ends. Each base end is coupled to the anchor face and each distal end is coupled to the upper end of one vertical arm. Hooks are receivable within openings in the rack mount system to secure the anchoring device. The apertures in the base portion align with the openings in the rack mount system when the anchoring device is secured to the rack mount system such that the object is securable to the rack mount system by engaging the fasteners with the apertures in the anchoring device.

13 Claims, 5 Drawing Sheets

(56) References Cited

U.S. PATENT DOCUMENTS

| | | | |
|---|---|---|---|
| 5,850,925 A | 12/1998 | Gandre | |
| 5,941,621 A * | 8/1999 | Boulay | H05K 7/1421 |
| | | | 312/334.4 |
| 6,021,047 A | 2/2000 | Lopez et al. | |
| 6,201,702 B1 | 3/2001 | Schmitt | |
| 6,422,399 B1 * | 7/2002 | Castillo | A47B 88/43 |
| | | | 211/175 |
| 6,538,894 B1 | 3/2003 | Treiber et al. | |
| 6,554,142 B2 * | 4/2003 | Gray | A47B 57/30 |
| | | | 211/175 |
| 6,577,498 B1 | 6/2003 | Land et al. | |
| 6,604,799 B2 | 8/2003 | Searby et al. | |
| 6,615,992 B1 | 9/2003 | Lauchner et al. | |
| 6,616,251 B2 | 9/2003 | Searby | |
| 6,681,942 B2 * | 1/2004 | Haney | H05K 7/1489 |
| | | | 211/183 |
| 6,726,295 B2 | 4/2004 | Searby | |
| 6,736,277 B2 | 5/2004 | Lauchner et al. | |
| 6,845,009 B1 | 1/2005 | Whitted | |
| 6,906,920 B1 | 6/2005 | Whitted | |
| 6,926,378 B2 * | 8/2005 | Greenwald | A47B 88/43 |
| | | | 312/334.4 |
| 6,945,412 B2 | 9/2005 | Felcman et al. | |
| 6,974,037 B2 | 12/2005 | Haney | |
| 7,012,808 B2 * | 3/2006 | Mayer | H05K 7/1489 |
| | | | 361/826 |
| 7,149,796 B2 | 12/2006 | Sanders | |
| 7,218,526 B2 | 5/2007 | Mayer | |
| 7,281,633 B2 * | 10/2007 | Hartman | H05K 7/183 |
| | | | 211/192 |
| 7,357,362 B2 * | 4/2008 | Yang | A47B 88/43 |
| | | | 248/245 |
| 7,401,796 B1 | 7/2008 | Greco | |
| 7,527,155 B2 | 5/2009 | McClain et al. | |
| 7,768,788 B2 | 8/2010 | Chen et al. | |
| 7,864,527 B1 | 1/2011 | Whitted | |
| 7,934,607 B2 * | 5/2011 | Henderson | H05K 7/1489 |
| | | | 248/220.21 |
| 8,011,742 B1 | 9/2011 | Whitted | |
| 8,016,126 B1 | 9/2011 | Whitted | |
| 8,118,178 B2 | 2/2012 | Olesiewicz et al. | |
| 8,197,124 B2 | 6/2012 | Claassen et al. | |
| 8,322,668 B2 * | 12/2012 | Tang | H05K 7/1489 |
| | | | 248/220.21 |
| 8,607,993 B2 * | 12/2013 | Williams | A47B 88/43 |
| | | | 211/26 |
| 8,727,138 B2 * | 5/2014 | Dittus | H05K 7/183 |
| | | | 312/334.4 |
| 9,723,747 B1 * | 8/2017 | Marrs | H05K 7/1489 |
| 9,974,203 B1 * | 5/2018 | Ho | H05K 7/1489 |
| 10,492,610 B2 * | 12/2019 | Chen | A47B 88/483 |
| 2001/0040203 A1 * | 11/2001 | Brock | H02B 1/34 |
| | | | 211/192 |
| 2004/0218368 A1 * | 11/2004 | Velez | H05K 7/1489 |
| | | | 361/727 |
| 2010/0200523 A1 * | 8/2010 | Henderson | H05K 7/18 |
| | | | 211/26 |
| 2012/0175477 A1 * | 7/2012 | Tang | H05K 7/1489 |
| | | | 248/224.8 |

OTHER PUBLICATIONS

Rackmount Duplicators from cdrom2go.com by USDigitalMedia. Accessed on Aug. 17, 2020 at https://www.cdrom2go.com/rackmount-duplicators.

File:Server rack rail dimensions.svg. Author: Sakurambo. Accessed on Aug. 17, 2020 at https://commons.wikimedia.org/wiki/File:Server_rack_rail_dimensions.svg.

Cage Nut Tool. Rackmount Solutions. Accessed on Aug. 17, 2020 at https://www.rackmountsolutions.net/cage-nut-removal-tool/.

International Search Report and Written Opinion for International Patent Application No. PCT/US2018/019402.

"StarTech.com M6 Cage Nuts For Server Rack Cabinet, Pack Of 50" accessed from https://www.officedepot.com/a/products/517401/StarTechcom-M6-Cage-Nuts-For-Server/ on Nov. 3, 2023.

* cited by examiner

SYSTEMS AND COMPONENTS FOR ANCHORING OBJECTS TO RACK MOUNT SYSTEMS AND ASSEMBLIES

CROSS-REFERENCE TO RELATED APPLICATIONS

This application is the U.S. national stage application of International Application PCT/US2018/019402, filed Feb. 23, 2018, which international application was published on Aug. 29, 2019, as International Publication WO 2019/164504 in the English language.

FIELD

The present disclosure generally relates to rack mount systems and assemblies. Particularly, the present disclosure relates to improved systems, assemblies, and components therein in which electronic and computing devices and equipment are anchored and/or secured to the rack mount systems and assemblies.

BACKGROUND

The Background and Summary are provided to introduce a foundation and selection of concepts that are further described below in the Detailed Description. The Background and Summary are not intended to identify key or essential features of the claimed subject matter, nor are they intended to be used as an aid in limiting the scope of the claimed subject matter.

Rack mount systems and assemblies for electronic and computing devices are known in the art. (See, e.g., U.S. Pat. Nos. 456,840; 8,197,124; 8,118,178; 8,016,126; 8,011,742; 7,864,527; 7,768,788; 7,527,155; 7,401,796; 7,218,526; 7,149,796; 7,012,808; 6,974,037; 6,945,412; 6,906,920; 6,845,009; 6,736,277; 6,726,295; 6,681,942; 6,616,251; 6,615,992; 6,604,799; 6,577,498; 6,538,894; 6,201,702; 6,021,047; 5,850,925; 5,791,498; and 5,680,579; the contents of which are incorporated herein by reference in their entireties). Typical rack mount systems and assemblies include a series of vertical frame members as well as horizontal frame members that together provide a frame for anchoring objects such as electronic and computing devices. Each of the front facing vertical frame members typically has a series of vertically spaced openings or holes, which commonly are square-shaped. The openings or holes are configured such that an object can be secured to the rack mount system by inserting fastening components through openings or vertically aligned pairs of openings in the vertical frame members. The fastening components in common usage typically include a cage nut component and a bolt component. The cage nut component includes a nut mounted in a clip support. When the clip support of the cage nut component is compressed and the cage nut component is inserted into an opening or hole of a vertical frame member and released, the cage nut component is retained in the opening or hole and provides a nut into which a bolt component can be inserted. In order to secure an object to the rack mount system, the bolt component either alone or with a washer may be inserted, for example, through an opening or hole in the object or a through an opening or hole in a supporting frame of the object, and into the nut of the cage nut component and tightened.

However, cage nut components in the art sometimes are difficult to insert into the holes in the vertical frame members and may require special tools or a user otherwise may pinch a finger when depressing and inserting the clip support of the cage nut component. Also, cage nut components are relatively expensive and require separate manufacturing of the nut and the clip support. For these reasons, improved systems and components for anchoring objects to rack mount systems and assemblies are desirable.

SUMMARY

Disclosed are systems and components for mounting objects in rack mount systems and assemblies. The disclosed components in particular may include one or more adapter components for mounting objects in rack mount systems and assemblies.

One embodiment of the present disclosure generally relates to an anchoring device for securing an object within a rack mount system using fasteners, where the rack mount system has a frame that defines a plurality of openings. The anchoring device includes a base portion having a flush face that is opposite an anchor face, which each extend from an upper edge to a lower edge and also from a first side to a second side. The base portion defines a plurality of apertures within the anchor face. A plurality of hooks are provided for securing the anchoring device to the rack mount system. Each of the plurality of hooks includes a horizontal arm and a vertical arm. Each horizontal arm has a base end that is opposite a distal end and each vertical arm has an upper end that is opposite a lower end. The base end of each horizontal arm is coupled to the anchor face of the base portion and the distal end of each horizontal arm is coupled to the upper end of one vertical arm. Each of the plurality of hooks is configured to be received within the plurality of openings in the rack mount system such that the anchoring device is secured to the rack mount system. The plurality of apertures in the base portion align with the plurality of openings in the rack mount system when the anchoring device is secured to the rack mount system such that the object is securable to the rack mount system by engaging at least one of the fasteners with at least one of the plurality of apertures in the anchoring device.

Another embodiment generally relates to an anchoring device for securing an object within a rack mount system using fasteners, where the rack mount system has a frame that defines a plurality of openings. The anchoring device includes a base portion having a flush face that is opposite an anchor face, which each extend from an upper edge to a lower edge and also from a first side to a second side. The base portion defines a plurality of apertures within the anchor face. A magnet is provided within the anchor face of the base portion. The magnet is configured to secure the anchoring device onto the rack mount system such that the plurality of apertures is aligned with the plurality of openings in the frame of the rack mount system. The object is securable to the rack mount system by engaging at least one of the fasteners with at least one of the plurality of apertures in the base portion when the anchoring device is secured onto the rack mount system.

Another embodiment generally relates to a system for securing objects. The system includes a rack mount system with a plurality of vertical members and a plurality of horizontal members that together define a frame with a prismatic shape. The plurality of vertical members define a plurality of openings therethrough. The system further includes a plurality of anchoring devices having a base portion with a flush face that is opposite an anchor face, which each extend from an upper edge to a lower edge and also from a first side to a second side. The base portion defines a plurality of apertures within the anchor face. A plurality of hooks is provided for securing the anchoring device to the rack mount system, each of the plurality of hooks having a horizontal arm and a vertical arm. Each horizontal arm has a base end that is opposite a distal end, and each vertical arm has an upper end that is opposite a lower end. The base end of each horizontal arm is coupled to the anchor face of the anchoring device and the distal end of each horizontal arm is coupled to the upper end of one vertical arm. The system further includes a plurality of fasteners each configured to extend through one of the plurality of openings defined in the rack mount system and to engage with one of the plurality of apertures defined in one of the plurality of anchoring devices. Each of the plurality of hooks is configured to be received within the plurality of openings in the rack mount system such that the anchoring device is secured thereon. The plurality of apertures in the base portion are aligned with the plurality of openings in the rack mount system when the anchoring device is secured to the rack mount system such that one of the objects is securable to the rack mount system by engaging one of the plurality of fasteners with at least one of the plurality of apertures in the anchoring device.

Various other features, objects and advantages of the disclosure will be made apparent from the following description taken together with the drawings.

BRIEF DESCRIPTION OF THE DRAWINGS

The drawings illustrate examples of carrying out the disclosure. The same numbers are used throughout the drawings to reference like features and like components. In the drawings.

DETAILED DISCLOSURE

This written description uses examples to disclose embodiments of the present application, including the best mode, and also to enable any person skilled in the art to practice or make and use the same. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

In a time when computing devices and other electronics have become essential to the everyday operation and working environments of nearly every industry, rack mount systems have become the standard for providing the necessary support and protection for such systems. Rack mount systems generally known in the art typically comprise a frame shaped as a rectangular prism, whereby various objects can be mounted to the rack mount system in vertical alignment. Typically, the objects are mounted and thus accessible from a single side of the rack mount system. However, it is sometimes necessary or desirable to mount an object on multiple sides of the rack mount system or to brackets or supports spanning across multiple sides. This is particularly true for a very heavy object, whose weight is such that cantilevered support from a single side of the rack mount system may damage or deflect the rack mount system's frame.

Figure 1:
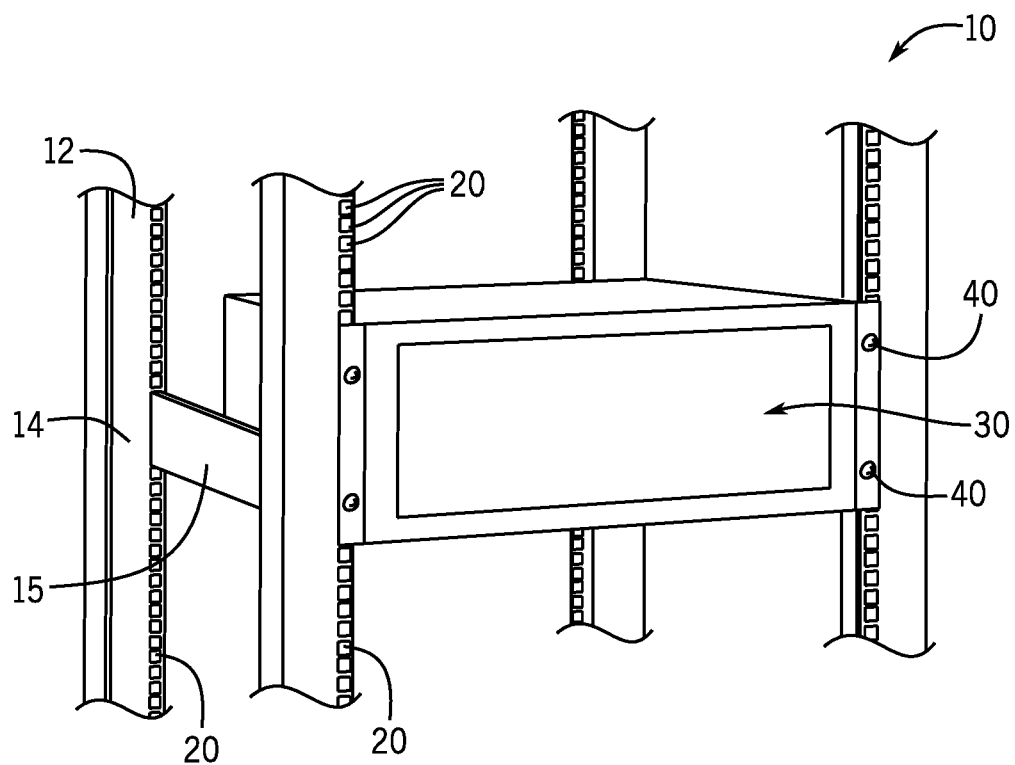
FIG. 1 depicts a partial perspective view of a rack mount system known in the art.

FIG. 1 depicts a partial view of an exemplary rack mount system 10 known in the art, which is shown with a single object 30 being secured or mounted therein. The rack mount system 10 includes a series of vertical members 14, as well as horizontal members 15, that together provide the frame 12 for anchoring objects 30. Each of the vertical members 14 defines a series of openings 20, which can be either circular or square shaped. Likewise, the openings 20 may be spaced apart uniformly, but are often arranged in a three-gang configuration whereby the openings 20 are evenly spaced within a gang. The openings 20 are configured such that an object 30 can be secured to the rack mount system 10 by inserting a fastener 40 through the object 30, through an opening 20, and into engagement with an anchoring device on the opposite side of the vertical member 14. In many cases, a total of four fasteners 40, four corresponding anchoring devices (such as cage nuts 2, discussed below), and four openings 20 are used to mount one object 30. For cost reasons, modern rack mount systems 10 often include openings 20 that are stamped to be square shaped rather than being circular. However, any shape of opening configured to accept a fastener 40 will suffice.

Figure 2:
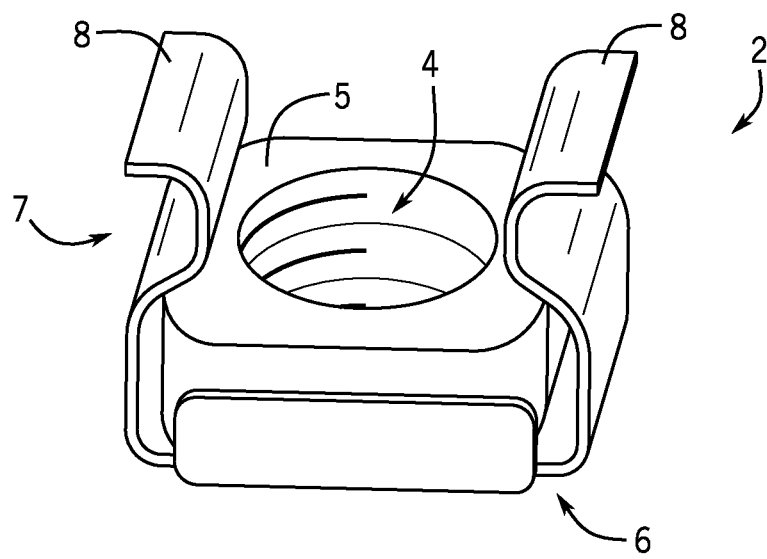
FIG. 2 depicts a cage nut for securing an object to the rack mount system shown in FIG. 1.

A typical rack mount system 10 also provides that the openings 20 are simple, straight-through holes, not having any threading or other means for directly engaging with a fastener 40. Therefore, as shown in FIG. 2, rack mount systems 10 known in the art rely upon the use of a cage nut 2 being inserted on an opposite side of a vertical member 14 as the fastener 40 to be engaged therein. This too saves on cost, whereby the cage nut 2 is inserted only in the particular openings 20 that are necessary for engagement. The cage nut 2 shown in FIG. 2 is typical of those known in the art, which have an inner face 5 configured to be flush with the vertical member 14 of the rack mount system 10, as well as an opposite outer face 6. A threaded opening 4 is defined between the inner face 5 and the outer face 6, which may be integrally defined, or provided within a separate nut that is captured between the inner face 5 and outer face 6 of the cage nut 2. Clips 8 on the cage nut 2 are configured such that when the cage nut 2 is inserted into one of the openings 20 in the rack mount system 10, the edges of the vertical member 14 surrounding the opening 20 are retained within the recess 7 such that the cage nut 2 becomes fixed.

The present inventor has identified that the cage nuts 2 known in the art are incredibly difficult to use, both when inserting and removing them from a rack mount system 10. Moreover, cage nuts 2 are often quite sharp and easy to drop, providing a risk of injury for the user, and a risk of causing shorts or becoming lost within the rack mount system 10 when dropped. Furthermore, time is lost in retrieving such lost cage nuts 2, which may even require removal of an object 30 to gain access.

Figure 3:
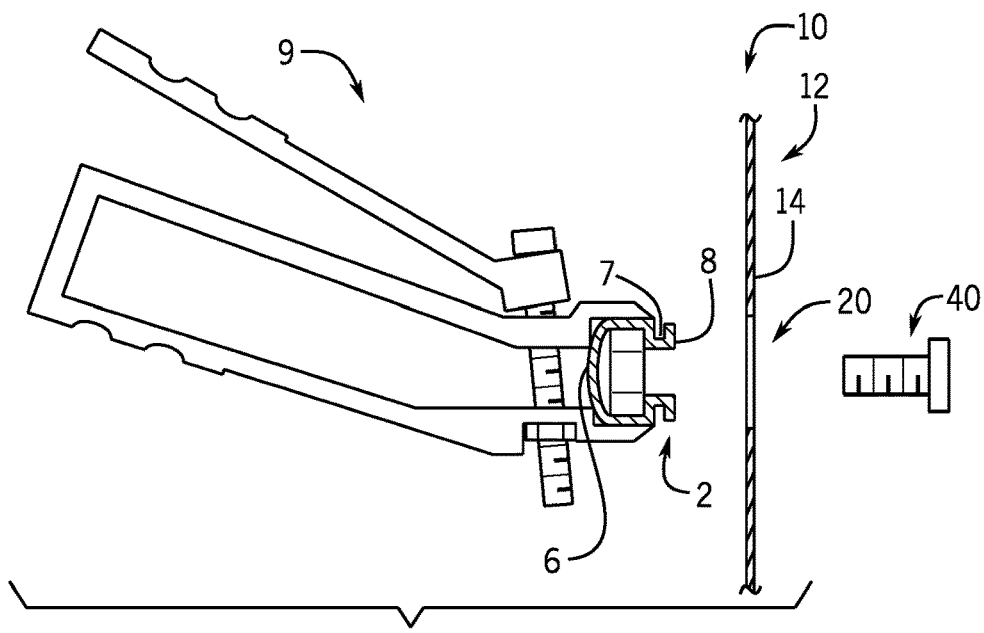
FIG. 3 depicts an insertion tool known in the art that assists in the insertion or removal of the cage nut shown in FIG. 2 into or from the rack mount system shown in FIG. 1.

Some users of rack mount systems 10 use an insertion tool 9 known within the industry that is intended to aid in the insertion or removal of a cage nut 2 from a rack mount system 10. One such exemplary insertion tool 9 is shown in FIG. 3. As will be recognized, the insertion tool 9 is used much like a nail clipper, which engages within the recesses 7 of the clips 8 to compress the clips 8 to be closer together, thereby rendering insertion of the cage nut 2 into the opening 20. Once the cage nut 2, and specifically the clips 8, are inserted into the opening 20, the insertion tool 9 is released such that the clips 8 engage with the edges of the vertical member 14 surrounding the opening 20 to retain the cage nut 2 to the frame 12. The opposite process can be used to aid in the removal process. However, the present inventor has further identified that insertion tools 9 known in the art are also difficult to use, challenging to manipulate within a rack mount system 10, and nonetheless create the risk of dropping a cage nut 2 during use.

Accordingly, the present inventor has identified the need for an improved system and device for anchoring objects 30, including within existing rack mount systems 10. In particular, an anchoring system or device is needed that can be retrofittable to work with rack mount systems 10 already in existence, as well as with objects 30 and simple fasteners 40, such as those presently used in conjunction with cage nuts 2.

Figure 4:
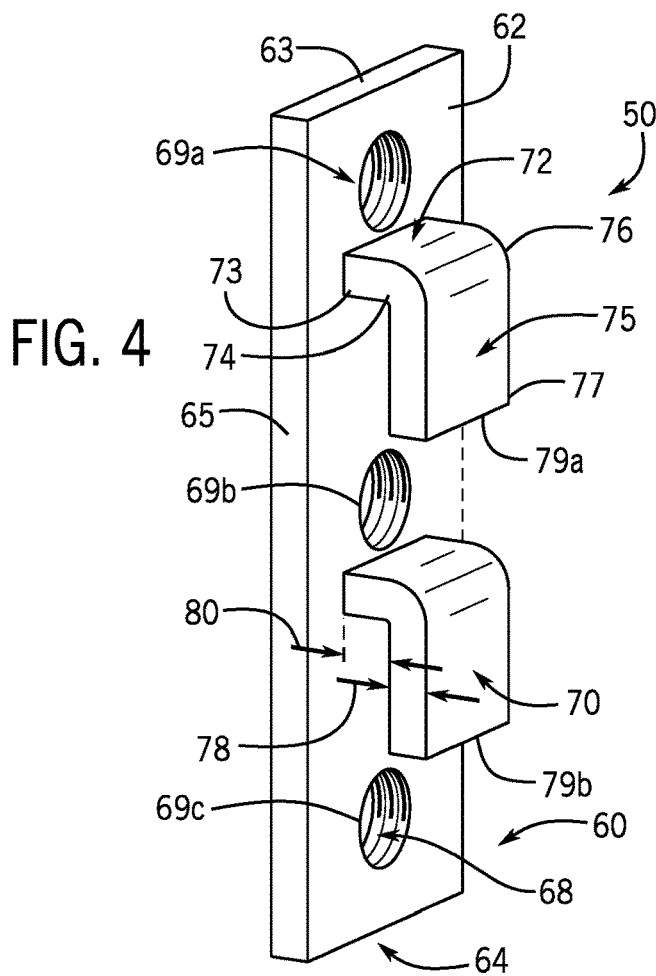
FIG. 4 depicts one embodiment of an anchoring device for securing an object to a rack mount system according to the present disclosure.
Figure 6:
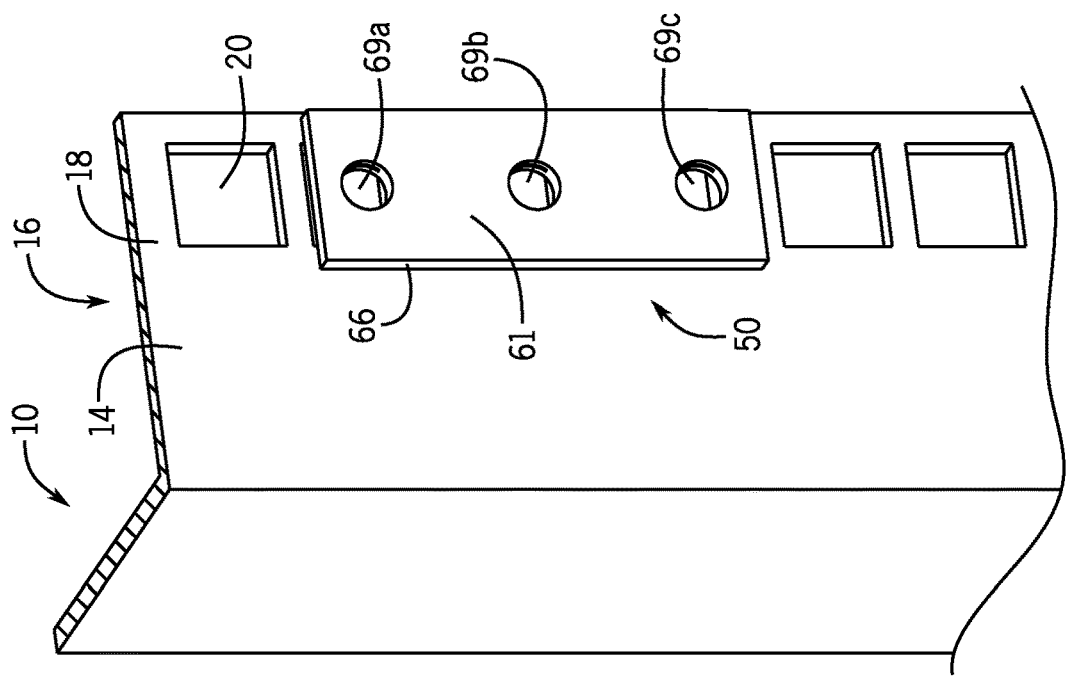
FIGS. 5 and 6 depict two configurations for using the anchoring device shown in FIG. 4 with a rack mount system known in the art.
Figure 5:
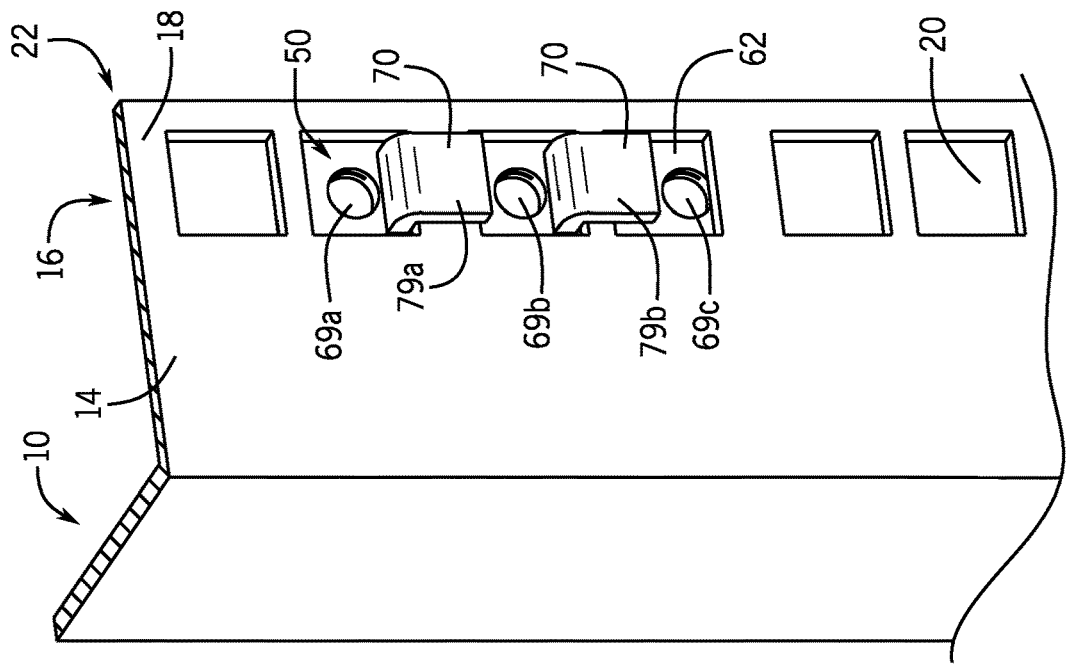

FIGS. 4-6 depict an anchoring device 50 for securing an object 30 within a rack mount system 10 using fasteners 40 (FIG. 1) according to the present disclosure. The anchoring device 50 includes a base portion 60 that has a flush face 61 and an anchor face 62 that each extend from an upper edge 63 to a lower edge 64, and from a first side 65 to a second side 66 (FIG. 6). The base portion 60 defines a series of apertures 68 within the anchor face 62, which are each configured to be engaged with a fastener 40. In certain embodiments, the fastener 40 and the apertures 68 are threaded, such as fasteners 40 and cage nuts 2 (specifically threaded openings 4) known in the art. However, other embodiments may include other types of fasteners, including press fit, ¼ turn lock mechanisms, and other types of fasteners known in the art.

A series of hooks 70 for securing the anchoring device 50 to the rack mount system 10 are also provided. In the embodiment shown, each hook 70 includes a substantially horizontal arm 72 and a substantially vertical arm 75. Each of the horizontal arms 72 has a base end 73 that is opposite a distal end 74. Likewise, each of the vertical arms 75 has an upper end 76 that is opposite of a lower end 77. As shown in the embodiment of FIG. 4, the base end 73 of each horizontal arm 72 is coupled to the anchor face 62 of the anchoring device 50, and the distal end 74 of each horizontal arm 72 is coupled to the upper end 76 of one of the vertical arms 75.

One of ordinary skill in the art will recognize that the hook 70 may be fixed to the anchoring device 50 in many different ways. These include the hook 70 and anchoring device 50 being integrally formed, such as through a casting, 3D printing, or injection molding, or the hook 70 being subsequently coupled to the anchoring device 50 through welding, adhesives, or other methods known in the art, for example.

As best shown in FIG. 5, the hooks 70 are configured to be received within the openings 20 in the frame 12 of the rack mount system 10 such that the anchoring device 50 is secured on the rack mount system 10 without the use of a fastener 40. It can further be seen that when the anchoring device 50 is secured onto the rack mount system 10, the apertures 68 in the base portion 60 of the anchoring device 50 are aligned with the openings 20 in the frame 12. In this manner, an object 30 can be secured to the rack mount system 10 by engaging at least one of the fasteners 40 with at least one of the apertures 68 in the base portion 60.

In the embodiment of FIG. 4, the anchoring device 50 has three individual apertures 69a-c and two individual hooks 79a-b. In certain embodiments, each of the horizontal arms 72 in the anchoring device 50 is perpendicular to both the base portion 60 of the anchoring device 50, and to the vertical arm 75.

FIGS. 5 and 6 depict two configurations for using the anchoring device 50 of FIG. 4, each being usable for anchoring an object 30 to the rack mount system 10. The vertical members 14 of the rack mount system 10 are shown to have an inner face 16 and an opposite outer face 18, also defining a thickness 22 therebetween. Under this terminology, FIG. 5 depicts an anchoring device 50 secured to the rack mount system 10 such that the anchor face 62 of the anchoring device 50 is in contact with the inner face 16 of one of the vertical members 14. In contrast, FIG. 6 depicts the anchor face 62 of the anchoring device 50 being in contact with the outer face 18 of the vertical member 14 when the anchoring device 50 is secured to the rack mount system 10. In each case, a gap 80 (FIG. 4) defined between the vertical arm 75 and the base portion 60 of the anchoring device 50 is configured to correspond to the thickness 22 of the vertical member 14. IN this manner, a part of the vertical member 14 is accepted within the gap 80 when the anchoring device 50 is secured to the rack mount system 10. It should be recognized that the anchoring device 50 remains upwardly unrestrained when the anchoring device 50 is secured to the rack mount system 10. However, the anchoring device 50 becomes upwardly restrained once an object 30 is secured to the rack mount system 10 with fasteners 40 engaging with that anchoring device 50. Therefore, the anchoring device 50 is not at risk of moving and becoming disengaged with the vertical members 14 since the engagement between a fastener 40 and the opening 20 within the frame 12 subsequently prevents such upward mobilization of the anchoring device 50. The anchoring device 50 may alternatively be secured to the frame 12 as shown in FIG. 6, removing the need for the user to reach into the rack mount system for insertion or removal. This also further reduces the risk of dropping items inside the rack mount system 10, which is already minimized by using the presently disclosed anchoring device 50.

Figure 8:
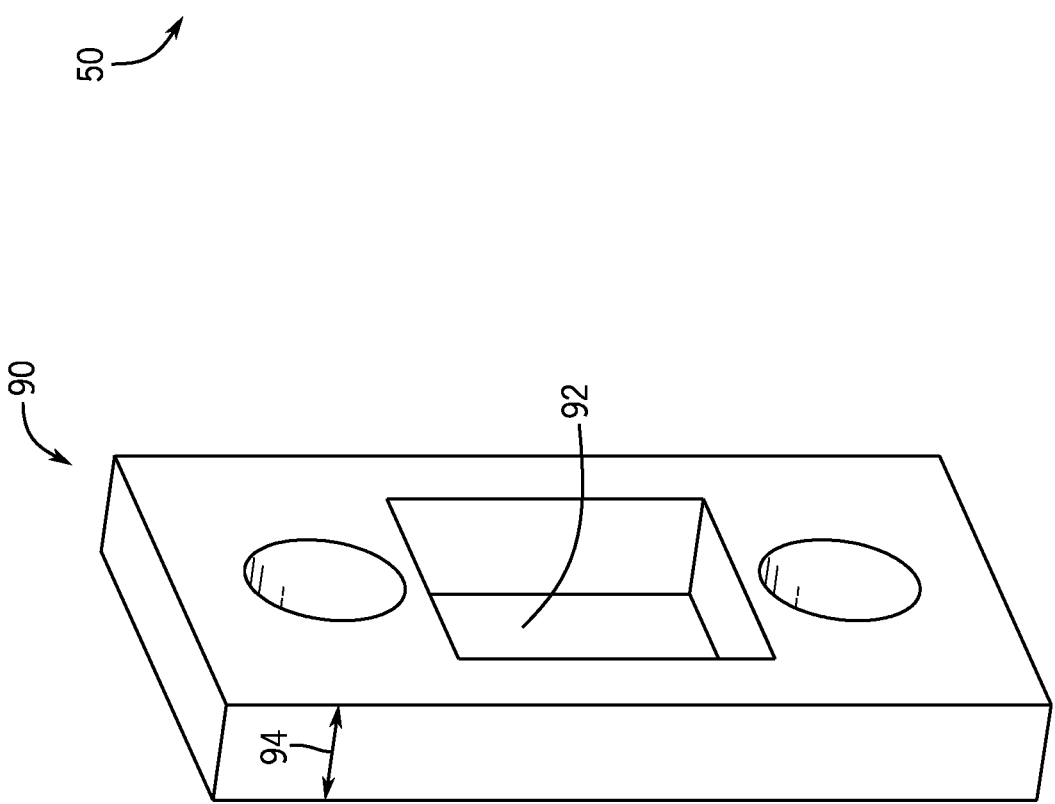
FIG. 8 depicts a flush-mount plate that is usable with an anchoring device such as is shown in FIG. 7 to provide a surface of uniform thickness according to the present disclosure.

In certain circumstances, it may be desirable to insert the anchoring device 50 in the rack mount system 10 as shown in FIG. 5, but also desirable for the object 30 to be in contact with more than the vertical arm 75 of each hook 70 when coupled to the rack mount system 10. Therefore, to provide a larger contact surface similar to the arrangement shown in FIG. 6, certain embodiments also provide a flush-mount plate 90 (FIG. 8) configured to be seated over the hook 70. This provides a surface of uniform thickness for mounting the object 30, as the thickness 94 of the flush-mount plate 90 is designed to be approximately the same as the thickness 78 of the vertical arm 75 when the hook 70 is received within the opening 92 of the flush-mount plate 90. Once again, a surface of uniform thickness can also be provided by the arrangement shown in FIG. 6 if the anchoring device 50 can be inserted into the rack mount system 10 such that the anchor face 62 of the anchoring device 50 is in contact with the outer face 18 of the frame 12.

As previously discussed, the embodiment shown in FIG. 4 depicts an anchoring device 50 having two individual hooks 79a-b and three individual apertures 69a-c. In certain embodiments, the two individual hooks 79a-b are interposed between the three individual apertures 69a-c, whereby the three individual apertures 69a-c are also vertically aligned and uniformly spaced apart. Likewise, the three individual apertures 69a-c remain unobstructed by the two individual hooks 79a-b such that each of the individual apertures 69a-c remains available for anchoring an object 30 as needed. Moreover, certain embodiments, such as that shown in FIG. 4, depict an anchoring device 50 having apertures 68 that are defined entirely through the base portion 60.

FIG. 4 further depicts an embodiment configured for a frame 12 having openings 20 that are square-shaped with a horizontal bottom. Specifically, each horizontal arm 72 of the hooks 70 is configured to rest flush on the horizontal bottom of one of the openings 20 when the anchoring device 50 is secured to the rack mount system 10. However, it should be recognized that other shapes for openings 20 within the rack mount system 10, as well as corresponding shapes of hooks 70 such that the hooks are receivable within these openings 20, are also anticipated by the present disclosure.

Figure 7:
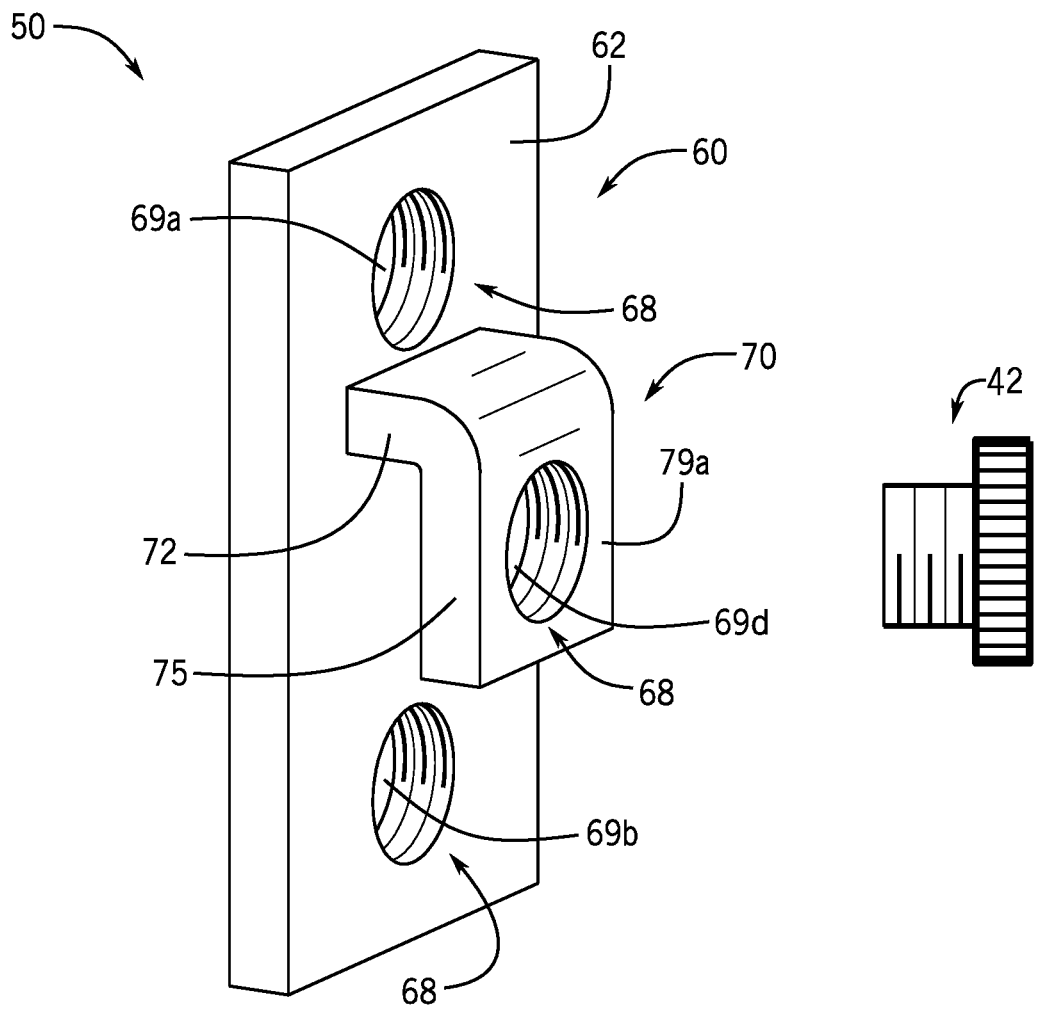
FIG. 7 depicts another embodiment of an anchoring device according to the present disclosure.

FIG. 7 depicts another embodiment according to the present disclosure, which is similar to that shown in FIG. 4. Unlike the embodiment of FIG. 4, the anchoring device 50 of FIG. 7 has two individual apertures 69a-b and a single individual hook 79a. Each of these embodiments is especially well suited for different applications, but they both generally provide the same function. The present inventor has identified that the embodiment of FIG. 7 is particularly advantageous in that it requires less material, but is nonetheless provides anchoring for an object 30 through engagement with a fastener 40 in use. Likewise, the present inventor has identified that the embodiment of FIG. 4 is particularly advantageous when it is desirable to have additional stability between the anchoring device 50 and the rack mount system 10 before any fasteners 40 have been engaged. Specifically, as the dual-action of the two individual hooks 79a-b further prevent movement or twisting between the anchoring device 50 and the rack mount system 10 before a fastener 40 is used to secure an object 30 to the rack mount system 10.

FIG. 7 also demonstrates an exemplary embodiment in which additional apertures 68 are also defined within the hooks 70. In the embodiment shown, one individual aperture 69d is defined within the single hook 70; however, the present disclosure also anticipates embodiments having greater or fewer apertures 68 defined within greater or fewer hooks 70 of an anchoring device 50. This individual aperture 69d is configured to receive a fastener 42, which in certain embodiments is a thumb screw for each of use. The present inventor has identified that the incorporation of the individual aperture 69d within one or more of the hooks 70 allows the user to clamp the anchoring device 50 to the rack mount system 10. This prevents the anchoring device 50 from inadvertently being bumped and falling off of the rack mount system 10 before a fastener 40 has been inserted into the anchoring device 50, which prevents such mobility. The present inventor has determined that this is particularly advantageous when using the anchoring device 50 as shown in FIG. 6, which ensures that the anchor face 62 of the anchoring device 50 is drawn tight and flush with the frame 12.

In certain embodiments, the fastener 42 is configured to not be removable from the individual aperture 69d to prevent loss inside the rack mount system 10 or elsewhere. In such cases, the fastener 42 is nonetheless configured to fit (along with the corresponding hook 70) through the corresponding opening 20 in the frame 12 of the rack mount system 10 to allow the anchoring device 50 to be inserted and removed in the manner previously described.

Figure 9:
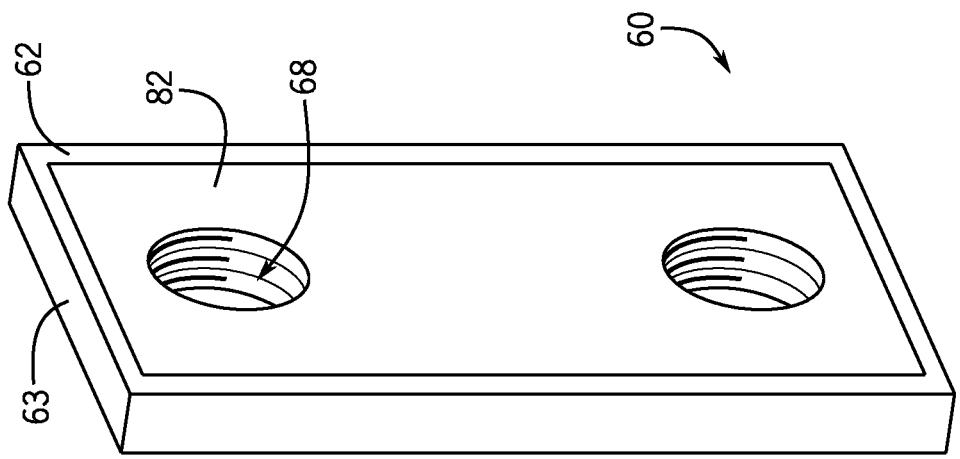
FIG. 9 depicts another embodiment of an anchoring device according to the present disclosure, including a magnet for securing the anchoring device to the rack mount system.

FIG. 9 depicts another embodiment of anchoring device 50 according to the present disclosure, this time without the use of hooks 70. In particular, the anchoring device 50 includes a magnet 82 embedded within the anchor face 62 of the base portion 60. The anchoring device 50 is configured to be used with a rack mount system 10 having vertical members 14 that are magnetically-receptive, such that placing the anchor face 62 of the anchoring device 50 on one of the vertical members 14 of the rack mount system 10 causes magnetic engagement therebetween. The anchoring device 50 is therefore configured such that it may be magnetically adhered to the inner face 16 of the vertical member 14 in a rack mount system 10 to be retained such that the apertures 68 in the anchoring device 50 align with the openings 20 within the frame 12. In this regard, the apertures 68, which in the present embodiment are threaded, are held in place on the opposite side of the vertical member 14 as the object 30 to be secured thereto. A fastener 40 can then be engaged through the object 30 and into the aperture 68 of the anchoring device to secure the object 30 to the rack mount system 10.

Magnets 82 may also be embedded within the flush-mount plates 90 previously described to retain them before fasteners 40 have been used.

Each of the embodiments presently discussed provides for simple, tool-free insertion and retraction of an anchoring device 50 from a rack mount system 10. Furthermore, each of the embodiments is fully retrofittable with rack mount systems 10 presently known in the art, whether having openings 20 that are circular, square, or shaped in other respects. These embodiments are further configured to work with objects 30 and fasteners 40 that are also known in the art. In this respect, each of the anchoring devices 50 can be used as a direct replacement for the cage nuts 2 and corresponding insertion tools 9 presently relied upon in the art, thereby improving upon rack mount systems 10 and the usability thereof.

In the above description, certain terms have been used for brevity, clarity, and understanding. No unnecessary limitations are to be inferred therefrom beyond the requirement of the prior art because such terms are used for descriptive purposes and are intended to be broadly construed. The different assemblies described herein may be used alone or in combination with other devices. It is to be expected that various equivalents, alternatives and modifications are possible within the scope of any appended claims.

I claim:

1. An anchoring device for securing an object within a rack mount system using fasteners, the rack mount system having a frame that defines a plurality of openings, the anchoring device comprising:
   a base portion having an anchor face configured to face an inner face of the frame of the rack mount system, the base portion also having three individual apertures within the anchor face, wherein each of the three individual apertures is threaded so as to threadedly engage the fasteners therein; and two individual hooks rigidly extending away from the anchor face of the base portion and configured for securing the anchoring device to the rack mount system, each of the two individual hooks being configured to be received within one of the plurality of openings in the rack mount system such that the anchoring device is secured thereto, wherein the two individual hooks are interposed between the three individual apertures, wherein the two individual hooks and the three individual apertures are configured to be vertically aligned when the anchoring device is secured to the rack mount system, and wherein an additional aperture is defined within at least one of the two individual hooks; and wherein the base portion and the two individual hooks are configured such that the three individual apertures in the base portion align with the plurality of openings in the rack mount system when the anchoring device is secured thereto such that the object is securable to the rack mount system by extending at least one of the fasteners though at least one of the plurality of openings in the rack mount system and into engagement with at least one of the three individual apertures in the anchoring device, wherein when the anchoring device is secured to the rack mount system the two individual hooks prevent the anchoring device from moving perpendicularly away from the rack mount system and the at least one of the fasteners prevents the anchoring device from moving upwardly within the rack mount system, and wherein the additional aperture is configured to receive an additional fastener to couple the anchoring device to the rack mount system.

2. The anchoring device according to claim 1, wherein each hook in the two individual hooks comprises a horizontal arm that is coupled to the anchor face of the base portion and a vertical arm that is coupled to the horizontal arm, and wherein the horizontal arm is perpendicular both to the base portion of the anchoring device and to the vertical arm.

3. The anchoring device according to claim 1, wherein the inner face is part of a vertical member of the frame of the rack mount system, and wherein the anchor face of the anchoring device is configured to contact the inner face when the anchoring device is secured to the rack mount system.

4. The anchoring device according to claim 3, wherein each hook in the two individual hooks comprises a horizontal arm that is coupled to the anchor face of the base portion and a vertical arm that is coupled to the horizontal arm, wherein a gap is defined between the vertical arm and the base portion of the anchoring device, and wherein the gap is configured to correspond to a thickness of the vertical member.

5. The anchoring device according to claim 4, wherein the anchoring device remains upwardly unrestrained by the two individual hooks when the anchoring device is secured to the rack mount system.

6. The anchoring device according to claim 4, further comprising a flush-mount plate having a plurality of openings configured to receive the two individual hooks therein, wherein the vertical arm of each of the two individual hooks has a thickness and the flush-mount plate has a thickness that is at least as great as the thickness of the vertical arm, and wherein the flush-mount plate is configured such that when the anchoring device is secured to the rack mount system, the flush-mount plate is positionable over the two individual hooks to provide a surface of uniform thickness.

7. The anchoring device according to claim 1, wherein each of the three individual apertures is unobstructed by the two individual hooks.

8. The anchoring device according to claim 1, wherein each of the three individual apertures is defined entirely through the base portion.

9. The anchoring device according to claim 1, wherein the anchoring device is brass, and wherein the three individual apertures comprises three or more individual apertures that are uniformly spaced apart.

10. The anchoring device according to claim 1, wherein only a combination of the object and the at least one of the fasteners prevent the anchoring device from moving upwardly within the rack mount system when the anchoring device is secured thereto.

11. The anchoring device according to claim 1, wherein only the two individual hooks extend away from the anchor face of the base portion.

12. A system for securing objects, the system comprising:
a rack mount system having a plurality of vertical members and a plurality of horizontal members that together define a frame having a prismatic shape, the plurality of vertical members defining a plurality of openings therethrough;

a plurality of anchoring devices, the plurality of anchoring devices comprising:

a base portion having a flush face that is opposite an anchor face, which each extend from an upper edge to a lower edge and also from a first side to a second side, wherein the base portion defines a plurality of apertures within the anchor face; and a plurality of hooks for securing the anchoring device to the rack mount system, each of the plurality of hooks having a horizontal arm and a vertical arm, wherein each horizontal arm has a base end that is opposite a distal end, wherein each vertical arm has an upper end that is opposite a lower end, and wherein the base end of each horizontal arm is coupled to the anchor face of the anchoring device and the distal end of each horizontal arm is coupled to the upper end of one vertical arm; and a plurality of fasteners configured to extend through a corresponding first plurality of openings from the plurality of openings defined in the rack mount system and to engage with one of the plurality of apertures defined in one of the plurality of anchoring devices;

wherein the plurality of hooks are configured to be received within the corresponding first plurality of openings in the rack mount system such that the anchoring device is secured thereon; and wherein at least one of the plurality of apertures in the base portion are aligned with at least one of the corresponding first plurality of openings in the rack mount system when the anchoring device is secured thereon such that one of the objects is securable to the rack mount system by inserting at least one of the plurality of fasteners within the at least one corresponding first plurality of openings and engaging the at least one of the plurality of fasteners with the at least one of the plurality of apertures in the anchoring device.

13. The system according to claim 12, wherein the plurality of apertures and the plurality of fasteners are correspondingly threaded, and wherein the anchoring device is configured to be secured to the rack independently of engagement between one of the plurality of fasteners and one of the plurality of apertures defined within the anchoring device.

\* \* \* \* \*